(12) United States Patent
Higashiuchi et al.

(10) Patent No.: US 9,334,573 B2
(45) Date of Patent: May 10, 2016

(54) LAYERED SILICATE SILVER SURFACE TREATMENT AGENT, SULFIDATION PREVENTION FILM AND LIGHT-EMITTING DEVICE WITH TREATED SILVER LAYER

(71) Applicant: HITACHI CHEMICAL COMPANY, LTD., Chiyoda-ku, Tokyo (JP)

(72) Inventors: Tomoko Higashiuchi, Tsukuba (JP); Nobuaki Takane, Tsukuba (JP); Masashi Yamaura, Tsukuba (JP); Maki Inada, Tsukuba (JP); Hiroshi Yokota, Chikusei (JP); Kazuyuki Kamo, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/372,519

(22) PCT Filed: Jan. 16, 2013

(86) PCT No.: PCT/JP2013/050634
§ 371 (c)(1),
(2) Date: Jul. 16, 2014

(87) PCT Pub. No.: WO2013/108773
PCT Pub. Date: Jul. 25, 2013

(65) Prior Publication Data
US 2014/0353706 A1    Dec. 4, 2014

(30) Foreign Application Priority Data
Jan. 16, 2012  (JP) .................................. 2012-006085

(51) Int. Cl.
*C23F 11/00*    (2006.01)
*C09D 1/00*    (2006.01)
(Continued)

(52) U.S. Cl.
CPC ................. *C23F 11/00* (2013.01); *C01B 33/26* (2013.01); *C09D 1/00* (2013.01); *C09D 1/02* (2013.01);
(Continued)

(58) Field of Classification Search
CPC ................................. H01L 33/44; C23F 11/00
USPC .......................................... 257/98; 423/328.1
See application file for complete search history.

(56) References Cited

U.S. PATENT DOCUMENTS 3,398,003 A * 8/1968 Smith et al. ....................... 106/3
4,549,374 A   10/1985 Basi et al.
(Continued)

FOREIGN PATENT DOCUMENTS

CN    1446252    10/2003
CN    102292802  12/2011
(Continued)

OTHER PUBLICATIONS

International Preliminary Report on Patentability of Appln. No. PCT/JP2013/050634 dated Jul. 31, 2014 in English.
(Continued)

*Primary Examiner* — Peter Bradford
(74) *Attorney, Agent, or Firm* — Fitch, Even, Tabin and Flannery LLP

(57) ABSTRACT

The silver surface treatment agent of the present invention contains a layered silicate compound. The light-emitting device of the present invention comprises a substrate having a silver-plated layer; a light-emitting diode mounted on the substrate; and a film, provided on a surface of the silver-plated layer, containing a layered silicate compound.

5 Claims, 12 Drawing Sheets

(51) Int. Cl.

| | | |
|---|---|---|
| *C09D 201/00* | (2006.01) | |
| *C23F 11/18* | (2006.01) | |
| *H01L 33/44* | (2010.01) | |
| *H01L 33/56* | (2010.01) | |
| *H01L 33/60* | (2010.01) | |
| *C09D 1/02* | (2006.01) | |
| *C09D 7/12* | (2006.01) | |
| *C01B 33/26* | (2006.01) | |
| *C08K 3/34* | (2006.01) | |
| *C08K 7/10* | (2006.01) | |

(52) U.S. Cl.
CPC .......... *C09D 7/1291* (2013.01); *C09D 201/00* (2013.01); *C23F 11/182* (2013.01); *H01L 33/44* (2013.01); *H01L 33/56* (2013.01); *H01L 33/60* (2013.01); *C08K 3/34* (2013.01); *C08K 7/10* (2013.01); *H01L 2224/45144* (2013.01); *H01L 2224/48091* (2013.01); *H01L 2224/48465* (2013.01); *H01L 2224/8592* (2013.01); *H01L 2924/0002* (2013.01)

(56) References Cited

U.S. PATENT DOCUMENTS

| | | | |
|---|---|---|---|
| 5,076,663 A | | 12/1991 | Arendt et al. |
| 6,165,369 A | * | 12/2000 | Tanis et al. ............... 210/705 |
| 6,382,816 B1 | | 5/2002 | Zhao et al. |
| 7,513,815 B2 | | 4/2009 | Israel et al. |
| 2003/0130139 A1 | * | 7/2003 | Komiyama et al. ........... 508/161 |
| 2005/0187326 A1 | * | 8/2005 | Nakazawa .................. 524/417 |
| 2009/0004386 A1 | | 1/2009 | Makela et al. |
| 2009/0078956 A1 | * | 3/2009 | Tseng et al. ................ 257/98 |
| 2010/0187563 A1 | * | 7/2010 | Kuramoto et al. ............. 257/99 |
| 2013/0011617 A1 | * | 1/2013 | Tasaki .................. B29C 45/14 428/148 |

FOREIGN PATENT DOCUMENTS

| | | |
|---|---|---|
| EP | 1316603 A1 | 6/2003 |
| EP | 1503137 A2 | 2/2005 |
| JP | 10-158572 A | 6/1998 |
| JP | 2004-238658 A | 8/2004 |
| JP | 2006-28462 * | 2/2006 |
| JP | 2006-077237 A | 3/2006 |
| JP | 2010-007013 A | 1/2010 |
| JP | 2010-248413 A | 11/2010 |
| WO | WO 02/14458 A1 | 2/2002 |
| WO | 2005076801 A2 | 8/2005 |

OTHER PUBLICATIONS

CN Office Action of Appln. No. 201380005622.7 dated May 19, 2015.

Search Report in counterpart EP Appln. No. 13738871.6 dated Oct. 12, 2015 in English language.

* cited by examiner (a)

(b)

(a)

(b)

LAYERED SILICATE SILVER SURFACE TREATMENT AGENT, SULFIDATION PREVENTION FILM AND LIGHT-EMITTING DEVICE WITH TREATED SILVER LAYER

TECHNICAL FIELD

The present invention relates to a surface treatment agent for preventing various kinds of silver or silver alloy from discoloring (corroding), an example of which is a surface treatment agent for preventing silver or silver alloy used in electronic components, lighting devices such as light-emitting diodes, silver-deposited surfaces thereof in particular, from discoloring (corroding). The present invention also relates to a light-emitting device comprising a substrate having silver or silver alloy and a light-emitting diode.

BACKGROUND ART

Silver and silver alloy have been in use for a long time as noble metals by utilizing their excellent optical and electrochemical properties for ornaments, coins, tableware, electronic materials, lighting devices, and dental materials. There have recently been rapidly increasing demands for them as reflecting materials for light-emitting diodes (LED). The light-emitting diodes have been in use as light sources replacing fluorescent lamps or incandescent light bulbs for lighting devices, automobile lights, and the like, while these light-emitting devices provide a substrate with a light-reflecting layer such as a silver-plated layer, so as to improve light extraction efficiency.

However, silver and silver alloy are chemically so unstable that they tend to react easily with oxygen in the air, moisture, hydrogen sulfide, sulfurous acid gas, and the like, thereby producing silver oxide and silver sulfide, which blacken the silver surface by discoloring (corroding).

As a method for preventing silver from discoloring (corroding) as such, organic corrosion inhibitors, for example, have been proposed (see, for example, Patent Literatures 1 and 2). However, these organic corrosion inhibitors have a drawback that they are less resistant to ultraviolet rays and likely to discolor when exposed to the ultraviolet rays for a long period of time. The light-emitting diodes used for lighting devices and automobiles employ near-ultraviolet rays, which make it difficult to apply the organic corrosion inhibitors.

As a material replacing the organic corrosion inhibitors, a modified silicone material having high gas sealability and ultraviolet resistance has been proposed to be applied as a sealing material for light-emitting diodes (see, for example, Patent Literature 3).

CITATION LIST

Patent Literature

Patent Literature 1: Japanese Patent Application Laid-Open No. H10-158572
Patent Literature 2: Japanese Patent Application Laid-Open No. 2004-238658
Patent Literature 3: Japanese Patent Application Laid-Open No. 2010-248413

SUMMARY OF INVENTION

Technical Problem

However, the modified silicone material has poor malleability. When it is used as a sealing material for a light-emitting diode, heat occurring upon driving generates a stress, thereby peeling it off. This lowers the gas sealability, which makes it hard to apply to light-emitting diodes.

It is an object of the present invention to provide a silver surface treatment agent which is excellent in preventing silver from discoloring (corroding) and can provide a silver surface with superb resistance to discoloring. It is another object of the present invention to provide a light-emitting device having a silver-plated layer which is excellent in resistance to discoloring.

Solution to Problem

The present invention provides a silver surface treatment agent containing a layered silicate compound.

The silver surface treatment agent of the present invention can form a film which is excellent in preventing silver from discoloring (corroding) and capable of providing a silver surface with superb resistance to discoloring. In particular, the silver surface treatment agent of the present invention can form a film which is excellent in resistance to sulfidation.

Preferably, from the viewpoint of resistance to discoloring, the layered silicate compound has an average longer side length of at least 30 nm but not exceeding 50000 nm.

The present invention also provides a substrate having a silver-plated layer; a light-emitting diode mounted on the substrate; and a film, provided on a surface of the silver-plated layer, containing a layered silicate compound.

The light-emitting device of the present invention can have a silver-plated layer which is excellent in resistance to discoloring.

Advantageous Effects of Invention

The present invention can provide a silver surface treatment agent which is excellent in preventing silver from discoloring (corroding) and capable of providing a surface of silver with superb resistance to discoloring. The present invention can also provide a light-emitting device having a silver-plated layer which is excellent in resistance to discoloring.

The silver surface treatment agent in accordance with the present invention is excellent in preventing silver or silver alloy from discoloring (corroding) and can provide a silver-deposited surface, in particular, with superb resistance to discoloring. The silver surface treatment agent in accordance with the present invention can prevent silver used in electronic components, lighting devices such as light-emitting diodes, and the like, for example, silver-deposited surfaces in particular, from discoloring (corroding).

DESCRIPTION OF EMBODIMENTS

The silver surface treatment agent in accordance with an embodiment contains a layered silicate compound.

Silver to which the surface treatment agent in accordance with the embodiment is applied encompasses silver alloy.

Laminating a layered silicate compound having a flat planar form on silver surfaces can exert gas sealability against gases such as hydrogen sulfide, for example, and can provide the silver surfaces, such as silver-deposited surfaces in particular, with excellent resistance to discoloring. The silver surface treatment agent of the embodiment can form sulfidation prevention films on the silver surfaces.

The inventors consider that the above-mentioned effects are obtained because of the following reason. The layered silicate compound has a planar form and has such a property as to swell when mixed with a solvent such as water and alcohol and disperse into the solvent. Applying the silver surface treatment agent of the embodiment, which contains the layered silicate compound, onto the silver surface and then removing the solvent therefrom can laminate particles of the layered silicate compound on the silver surface. This, the inventors think, has succeeded in forming a film which is excellent in blocking the hydrogen sulfide gas, which causes silver to discolor, in the air.

Examples of the layered silicate compound include smectites such as stevensite, hectorite, saponite, montmorillonite, and beidellite and mica. They may be used singly or in combination of two or more kinds.

The above-mentioned compound can more effectively exert gas sealability against hydrogen sulfide and the like when laminated on the silver surface while having a flat plate form with a thickness of 1 nm to 30 nm and an average longer side length of 30 to 50000 nm.

From the viewpoint of gas sealability against hydrogen sulfide and the like, the layered silicate compound has an average longer side length which is preferably 30 to 50000 nm, more preferably 100 to 50000 nm, further preferably 100 to 20000 nm. From the viewpoint of keeping the gas sealability and the original luster of silver, the average longer side length is preferably 100 nm to 5000 nm.

Figure 1:
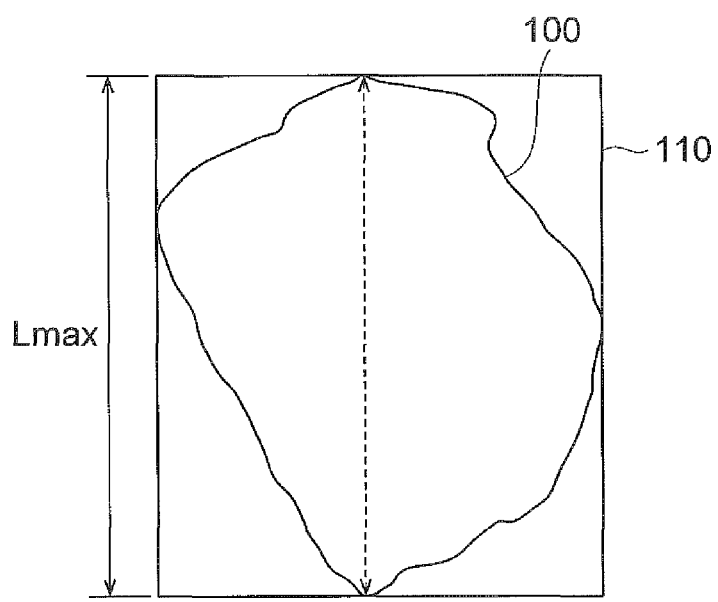
FIG. 1 is a diagram for explaining a longer side length of a layered silicate compound.

By the longer side length of the layered silicate compound is meant, when a flat sheet-like particle is seen from the upper side of a perpendicular thereto as illustrated in FIG. 1, the maximum length Lmax of a longer side of a rectangle 110 circumscribing this particle 100, which can be measured by using a transmission electron microscope, for example. By the average longer side length is meant, in a substrate having a layered silicate oxide compound formed thereon by applying a solution containing the layered silicate oxide compound and removing its solvent, a value obtained by averaging the longer side lengths of all the particles in an image of a transmission electron microscope photograph within an area of 100 μm (L)×100 μm (W) at a center part thereof. As a method for automatically determining the average longer side length, image analysis software for two-dimensional images (Ryushi Kaiseki Ver 3.5 manufactured by NSST) may also be used.

From the viewpoint of obtaining a gas barrier function, the thickness of the layered silicate compound is preferably 1 nm to 30 nm, more preferably 1 nm to 20 nm, further preferably 1 nm to 10 nm. The thickness is a value measured by an atomic force microscope or X-ray small angle scattering.

The silver surface treatment agent of the embodiment may further comprise a second silicate compound other than the above-mentioned layered silicate compound. This can improve the adhesion between silver and particles of the layered silicate compound, thereby yielding a higher level of gas sealability. Such effects, the inventors think, are caused by the fact that the second silicate compound contained can mitigate stresses at interfaces between silver and particles of the layered silicate compound, thereby improving the adhesive force.

As the silicate compound, at least one kind of water glass represented by the following general formula (I) may be used favorably:

$$M_2O \cdot nSiO_2 \quad (1)$$

where n=0.5 to 4.0, and M is an alkali metal of Li, Na, or K.

As the above-mentioned water glass, those listed in Japanese Industrial Standards (JIS K1408) may be used.

Preferably, the solid mass ratio between the layered silicate compound and the second silicate compound in the silver surface treatment agent in accordance with the embodiment is such that the layered silicate compound/second silicate compound=99/1 to 1/99. Here, the solid mass ratio is the mass ratio in the solid state containing no solvent and the like.

The solid mass ratio between the layered silicate compound and second silicate compound falling within the range mentioned above can yield with a favorable balance the effect of improving the adhesion to silver and thereby restraining gases such as hydrogen sulfide from transmitting through the bonding interfaces and the effect of blocking the gases by the layered silicate compound, thus attaining a higher level of the effect of restraining silver from discoloring.

From the viewpoint of improving the adhesion to silver and the gas sealability against hydrogen sulfide and the like, the solid mass ratio between the layered silicate compound and the second silicate compound is more preferably such that the layered silicate compound/second silicate compound=95/5 to 5/95, further preferably 80/20 to 20/80.

The silver surface treatment agent in accordance with the embodiment may contain a solvent. Water may be used favorably as the solvent, while polar solvents such as methanol, ethanol, and propanol can also be used.

From the viewpoint of film formability and the sealability against the hydrogen sulfide gas causing silver to discolor, the solid component concentration in the silver surface treatment agent in accordance with the embodiment is preferably 0.005 mass % to 2 mass %, more preferably 0.01 mass % to 1.5 mass %, further preferably 0.05 mass % to 1 mass %.

By using the silver surface treatment agent in accordance with the embodiment, a film constituted by a solid component contained in the surface treatment agent can be formed on a surface of silver or silver alloy. This film is excellent in blocking the hydrogen sulfide gas and can function as a silver sulfidation prevention film.

Specifically, after applying the silver surface treatment agent in accordance with the embodiment onto silver or silver alloy, the solvent is removed, whereby a film including the layered silicate compound contained in the surface treatment agent can be formed on silver or silver alloy. When the surface treatment agent contains the second silicate compound, a film including the layered silicate compound and second silicate compound can be formed on silver or silver alloy.

Preferably, the above-mentioned film is constituted by the layered silicate compound or the layered silicate compound and second silicate compound, whose organic matter content is less than 0.5%.

As a method for applying the silver surface treatment agent in accordance with the embodiment, techniques such as bar coating, dip coating, spin coating, spray coating, and potting, for example, may be used favorably.

As a method for removing the solvent from the coating of the silver surface treatment agent in accordance with the embodiment, drying may be used favorably, while the drying temperature is not limited in particular as long as it is at room temperature or higher. Here, the room temperature falls within the range from 20° C. to 25° C.

The present invention can provide silver or silver alloy having a film constituted by a solid component contained in the surface treatment agent of the above-mentioned embodiment. It can also provide a light-emitting device comprising a substrate having the silver or sliver alloy and a light-emitting diode. The light-emitting device may be sealed with a transparent resin. An example of the transparent resin is a silicone resin. The substrate having silver or silver alloy may have irregularities on its surface, and silver and silver alloy may have irregularities.

Preferred embodiments of methods for forming a silver sulfidation prevention film and manufacturing a light-emitting element using the silver surface treatment agent in accordance with the embodiment will now be explained with reference to the drawings. The same or equivalent parts will be referred to with the same signs in all the drawings.

First Embodiment

Before explaining the method for manufacturing a light-emitting device in accordance with the first embodiment, the structure of the light-emitting device manufactured by this method will be explained with reference to FIGS. 2 and 3.

Figure 2:
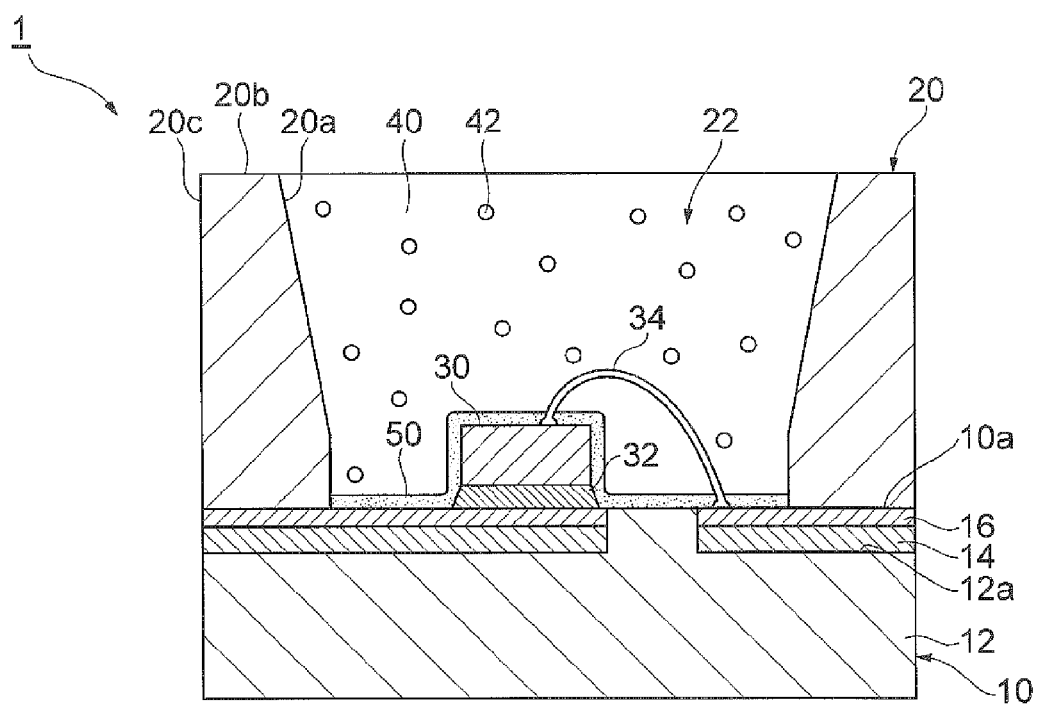
FIG. 2 is a sectional view of a light-emitting device.
Figure 3:
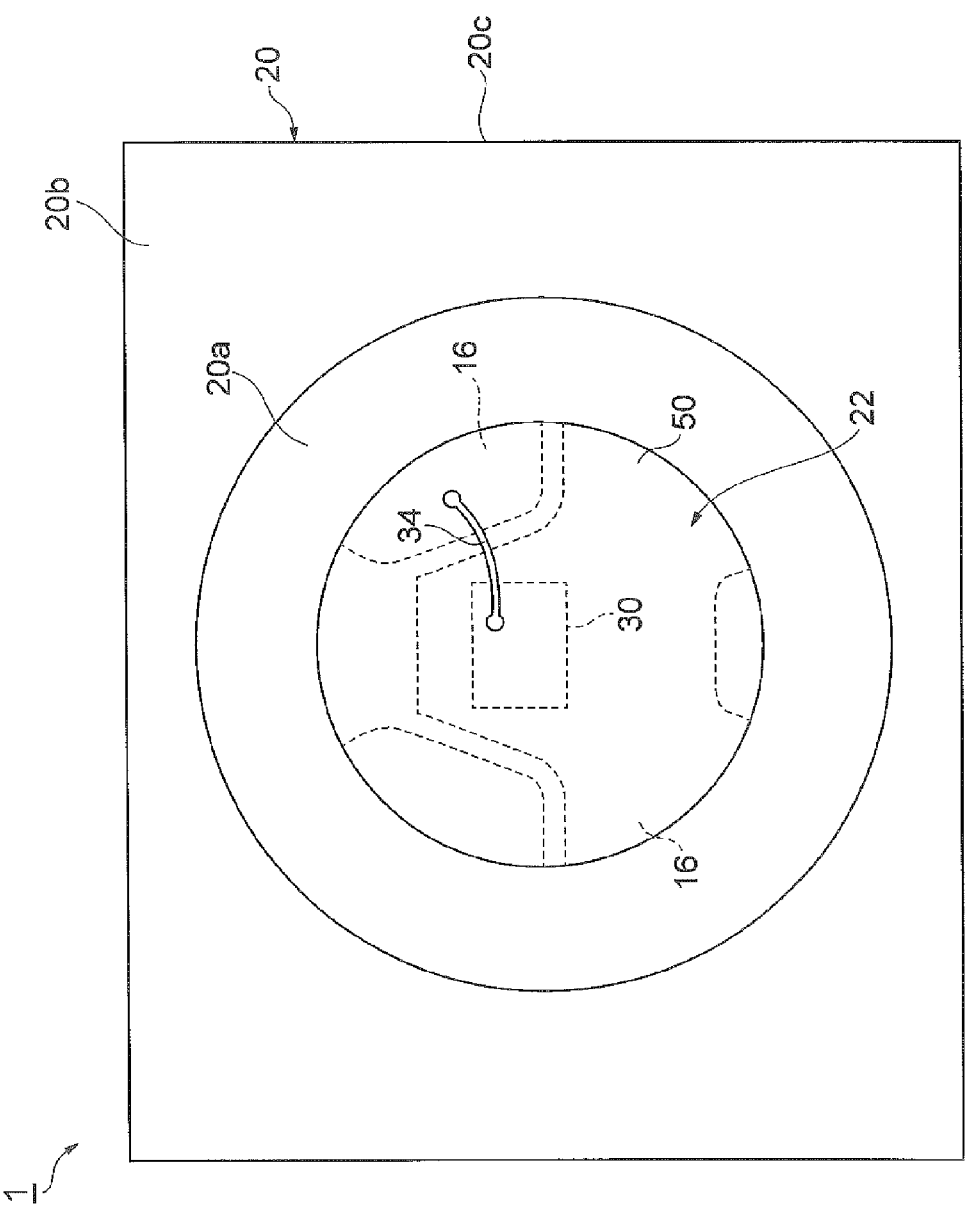
FIG. 3 is a plan view of the light-emitting device illustrated in FIG. 2.

FIG. 2 is a sectional view of the light-emitting device. FIG. 3 is a plan view of the light-emitting device illustrated in FIG. 2. As illustrated in FIGS. 2 and 3, the light-emitting device 1 in accordance with the embodiment is one classified as a surface mount type in general. The light-emitting device 1 comprises a substrate 10, a blue LED 30 bonded as a light-emitting element to the front face of the substrate 10, a reflector 20 disposed on the front face of the substrate 10 so as to surround the blue LED 30, and a transparent sealing resin 40 filling the reflector 20 so as to seal the blue LED 30. FIG. 3 does not depict the transparent sealing resin 40.

The substrate 10 has copper-plated sheets 14 laid out on the front face of an insulating support 12, while silver-plated layers 16 are formed on the front faces of the copper-plated sheets 14. The silver-plated layers 16 serve as electrodes which are arranged on the front face of the substrate 10 so as to be electrically connected to the blue LED 30. The silver-plated layers 16 may have any compositions as long as they are plated layers containing silver. For example, the silver-plated layers 16 may be formed by plating with silver alone or with nickel and silver in this order. The copper-plated sheet 14 and silver-plated layer 16 on the anode side are insulated from those on the cathode side. The copper-plated sheet 14 and silver-plated layer 16 on the anode side may be insulated from those on the cathode side by separating them from the latter and inserting an insulating layer made of a resin, ceramics, and the like therebetween as appropriate, for example.

The blue LED 30 is die-bonded to one of the silver-plated layers 16 on the anode and cathode sides, so as to be electrically connected to the silver-plated layer 16 through a die-bond material 32. The blue LED 30 is wire-bonded to the other of the silver-plated layers 16 on the anode and cathode sides, so as to be electrically connected to the silver-plated layer 16 through a bonding wire 34.

The reflector 20 is to be filled with the transparent sealing resin 40 for sealing the blue LED 30 and reflects light emitted from the blue LED 30 to the front side of the light-emitting device 1. The reflector 20 is erected on the surface of the substrate 10 so as to surround the blue LED 30. That is, the reflector 20 comprises an inner peripheral surface 20a which rises from the front face 10a of the substrate 10 so as to surround the blue LED 30 as a circle in planar view (see FIG. 3) forming an inner space 22 containing the blue LED 30 therewithin, a top surface 20b extending from a front-side edge of the inner peripheral surface 20a to the opposite side of the inner space 22, and an outer peripheral surface 20c falling from an outer edge of the top surface 20b onto the front face 10a of the substrate 10 as a rectangle in planar view (see FIG. 3). While the forms of the inner and outer peripheral surfaces 20a, 20c are not restricted in particular, it is preferred for the inner peripheral surface 20a to be formed into a circular truncated cone (funnel) which increases its diameter with distance from the substrate 10 from the viewpoint of improving the illuminance of the light-emitting device 1, and it is preferred for the outer peripheral surface 20c to be formed into a quadrangle perpendicular to the substrate 10 from the viewpoint of improving the degree of integration of the light-emitting device 1. The drawings illustrate, as an example of forms of the inner peripheral surface 20a, one in which the lower part located on the substrate 10 side is perpendicular to the substrate 10, while the upper part located on the opposite side of the substrate 10 increases its diameter with distance from the substrate 10.

The reflector 20 is constructed by a cured product of a thermosetting resin composition containing a white pigment. Preferably, from the viewpoint of easiness to form the reflector 20, the thermosetting resin composition is pressure-moldable at room temperature (25° C.) before being thermally cured.

Various kinds of resins such as epoxy, silicone, urethane, and cyanate may be used as thermosetting resins contained in the thermosetting resin composition. In particular, epoxy resins are preferred because of their superior adhesion to various materials.

As the white pigment, alumina, magnesium oxide, antimony oxide, titanium oxide, or zirconium oxide may be used. Among them, titanium oxide is preferred from the viewpoint of light reflectivity. Inorganic hollow particles may also be used as the white pigment. Specific examples of the inorganic hollow particles include sodium silicate glass, aluminum silicate glass, sodium borosilicate glass, and volcanic ash.

The transparent sealing resin 40 fills the inner space 22 formed by the inner peripheral surface 20a of the reflector 20, so as to seal the blue LED 30. The transparent sealing resin 40 is made of a transparent sealing resin which transmits light therethrough. The transparent sealing resin includes semi-transparent ones as well as completely transparent ones. Preferred as the transparent sealing resin is one having a modulus of elasticity of 1 MPa or lower at room temperature (25° C.). Preferably, from the viewpoint of transparency, silicone resins or acrylic resins are employed in particular. The transparent sealing resin may further comprise an inorganic filler which diffuses light and a fluorescent substance 42 which produces white light as being pumped with the blue light emitted from the blue LED 30.

In the light-emitting device 1 in accordance with this embodiment, the silver-plated layers 16 are covered with a silver sulfidation prevention film 50, while the transparent sealing resin 40 and the reflector 20 are joined to each other.

Figure 8:
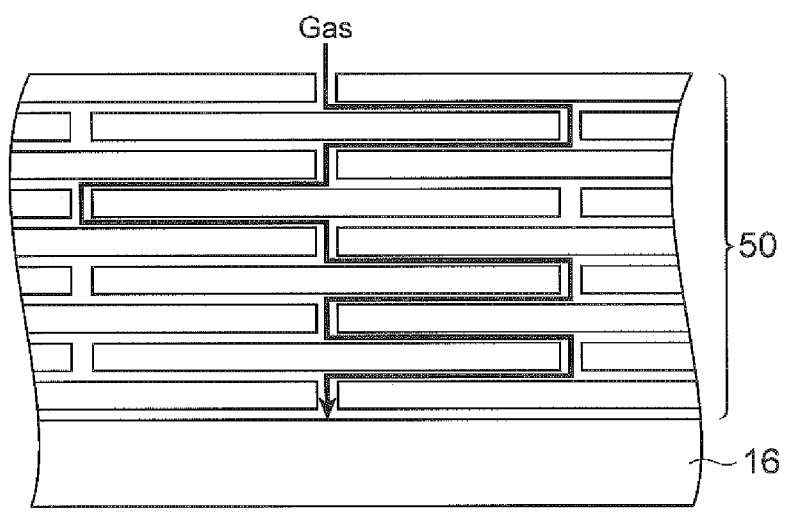
FIG. 8 is a conceptual diagram for explaining a structure of a silver sulfidation prevention film formed from the silver surface treatment agent in accordance with the embodiment.

The silver sulfidation prevention film 50, which covers the silver-plated layer 16 so as to restrain the silver-plated layer 16 from being sulfurized, is formed from the above-mentioned silver surface treatment agent of the embodiment. Since the silver surface treatment agent contains the layered silicate compound, a film having a long gas pass route and thus being excellent in gas barrier property is formed as illustrated in FIG. 8, whereby a superb gas barrier property can be obtained.

The thickness of the silver sulfidation prevention film 50 is preferably at least 0.01 μm but not exceeding 1000 μm, more preferably at least 0.03 μm but not exceeding 500 μm, further preferably at least 0.05 μm but not exceeding 100 μm, furthermore preferably at least 0.05 μm but not exceeding 10 μm, particularly preferably at least 0.05 μm but not exceeding 1 μm. The silver sulfidation prevention film 50 having a thickness of at least 0.01 μm but not exceeding 1000 μm can attain the resistance to discoloring for the silver-plated layer 16 and the transparency of the silver sulfidation prevention film 50 at the same time. These effects can further be improved by making the silver sulfidation prevention film 50 have a thickness of at least 0.03 μm but not exceeding 500 μm, at least 0.05 μm but not exceeding 100 μm, at least 0.05 μm but not exceeding 10 μm, or at least 0.05 μm but not exceeding 1 μm. Since the silver sulfidation prevention film 50 is formed from the silver surface treatment agent of the embodiment, cracks are hard to occur even at the thickness mentioned above.

The film thickness may be adjusted by changing the solvent content in the silver surface treatment agent so as to regulate the layered silicate compound concentration as appropriate, for example. The film thickness may also be adjusted by the amount of the silver surface treatment agent and the number of dropping operations.

From the viewpoint of improving the sulfidation prevention performance of the silver surface treatment agent, the layered silicate compound content in the silver sulfidation prevention film 50 based on the whole amount of the silver prevention film is preferably at least 5 mass %, more preferably at least 10 mass %, further preferably at least 80 mass %, furthermore preferably at least 90 mass %, particularly preferably 100 mass %.

A method for manufacturing the light-emitting device 1 in accordance with the first embodiment will now be explained.

Figure 4:
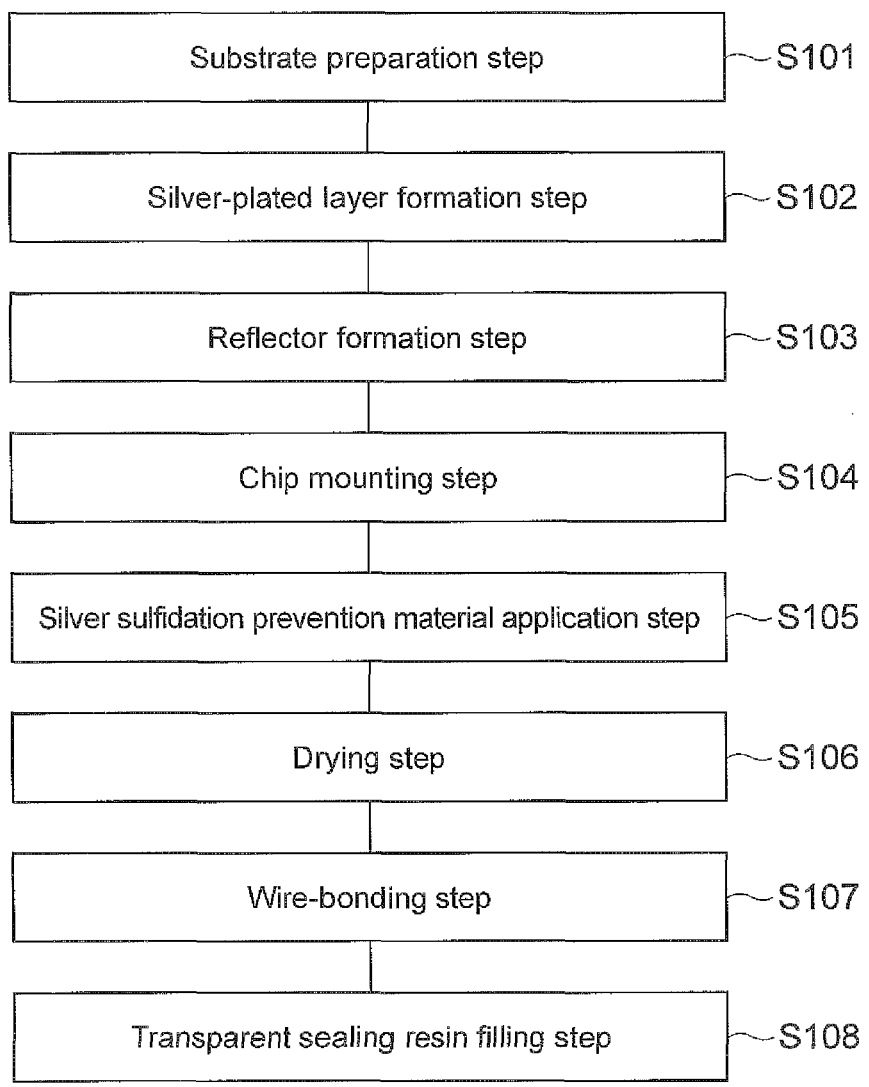
FIG. 4 is a flowchart illustrating a method for manufacturing the light-emitting device in accordance with a first embodiment.

FIG. 4 is a flowchart illustrating the method for manufacturing the light-emitting device 1 in accordance with the first embodiment. At first in the method for manufacturing the light-emitting device, as illustrated in FIG. 4, the insulating support 12 having the copper-plated sheets 14 laid out on the front face is prepared as a substrate preparation step (step S101), and the silver-plated layers 16 are formed on the copper-plated sheets 14 as a silver-plated layer formation step (step S102).

Subsequently, the reflector 20 is formed on the front face of the substrate 10 as a reflector formation step (step S103), and the blue LED 30 is mounted on the substrate 10 as a chip mounting step (step S104). The blue LED 30 is mounted to the substrate 10 by die-bonding the blue LED 30 to one of the silver-plated layers 16 on the anode and cathode sides in the inner space 22 surrounded by the reflector 20. This electrically connects the LED 30 to one of the silver-plated layers 16 on the anode and cathode sides through the die-bond material 32 and lets the blue LED 30 be surrounded by the reflector 20 and contained in the inner space 22.

Next, as a silver surface treatment agent application step (step S105), the silver surface treatment agent of the embodiment is applied to the silver-plated layers 16, so as to cover them.

The silver surface treatment agent is applied at the silver surface treatment agent application step (step S105), for example, by dropping or spraying the silver surface treatment agent from the front side of the substrate 10 to the inner space 22. Here, the amount of the silver surface treatment agent L dropped or sprayed is regulated such that at least all the silver-plated layers 16 are covered with the silver treatment agent L. In this case, for example, the silver surface treatment agent L may be dropped or sprayed to the inner space 22 so as to cover all over the silver-plated layers 16 and the blue LED 30 as illustrated in FIG. 5(a) or all over the silver-plated layers 16 and the blue LED 30 and a part of the inner peripheral surface 20a of the reflector 20 as illustrated in FIG. 5(b).

Subsequently, as a drying step (step S106), the coating of the silver surface treatment agent applied to the silver-plated layer 16 is dried, so as to form the silver sulfidation prevention film 50.

The drying step may be performed at a temperature at which the solvent volatilizes; for example, when water is used as the solvent, the temperature preferably falls within the range of at least 30° C. but not exceeding 80° C., more preferably at least 30° C. but not exceeding 70° C., further preferably at least 30° C. but not exceeding 60° C. This temperature range may be kept for at least 5 min, for example, and from the viewpoint of drying sufficiently, it is preferably kept for at least 5 min but not exceeding the whole day, more preferably at least 5 min but not exceeding 30 min.

Figure 5:
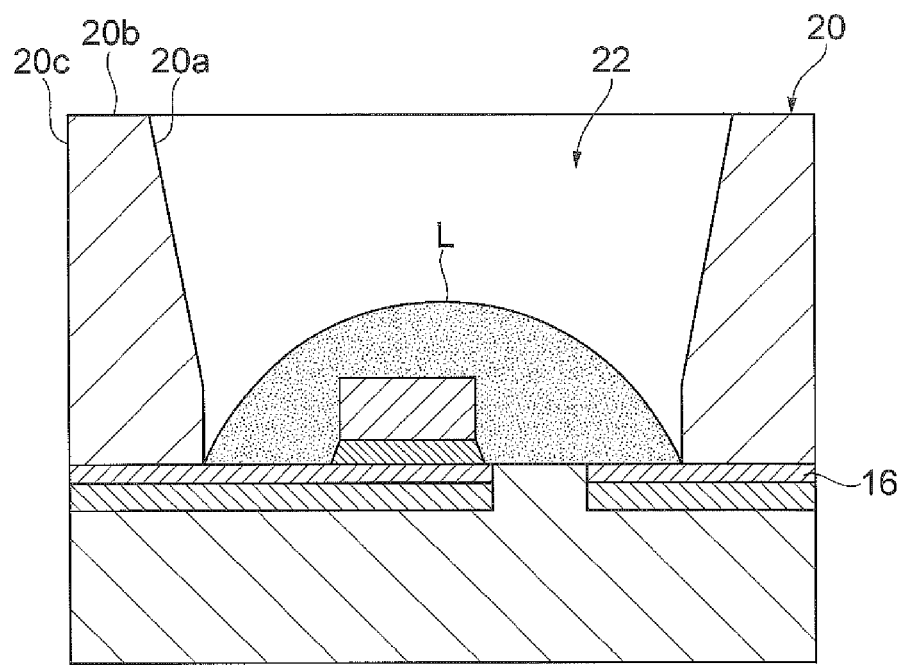
FIG. 5 is a set of sectional views of the light-emitting device after a step of applying a silver surface treatment agent in accordance with the embodiment.
Figure 5:
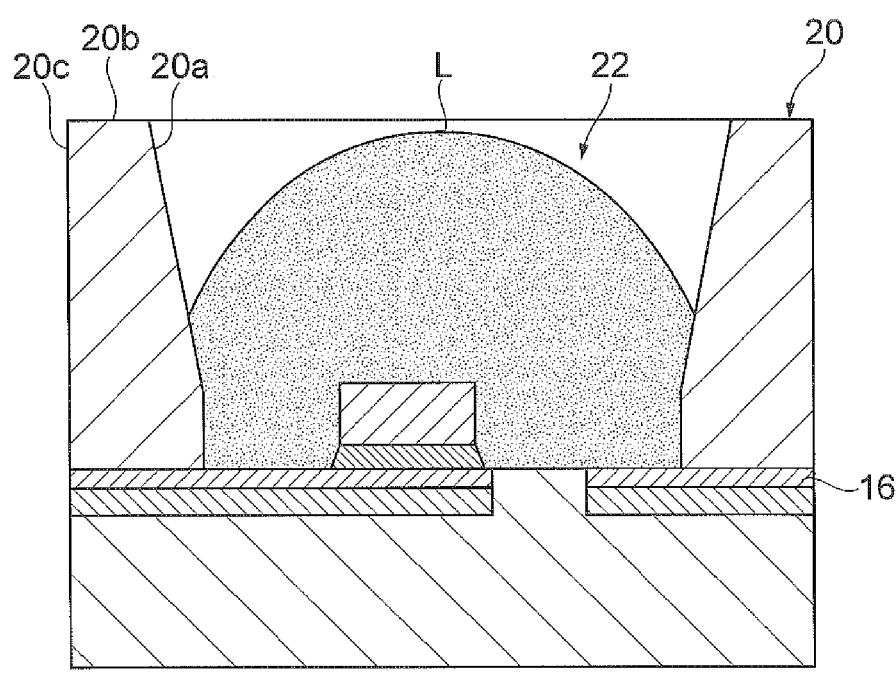
Figure 6:
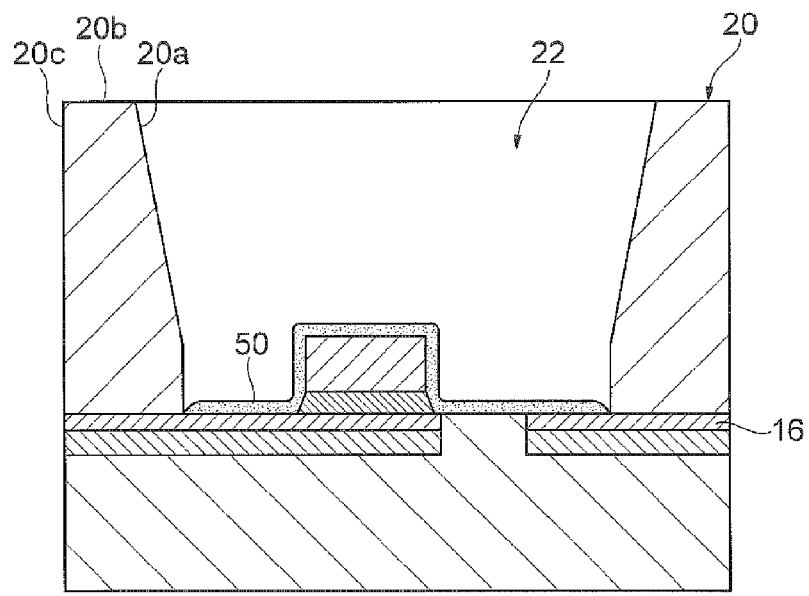
FIG. 6 is a set of sectional views of the light-emitting device after a drying step.
Figure 6:
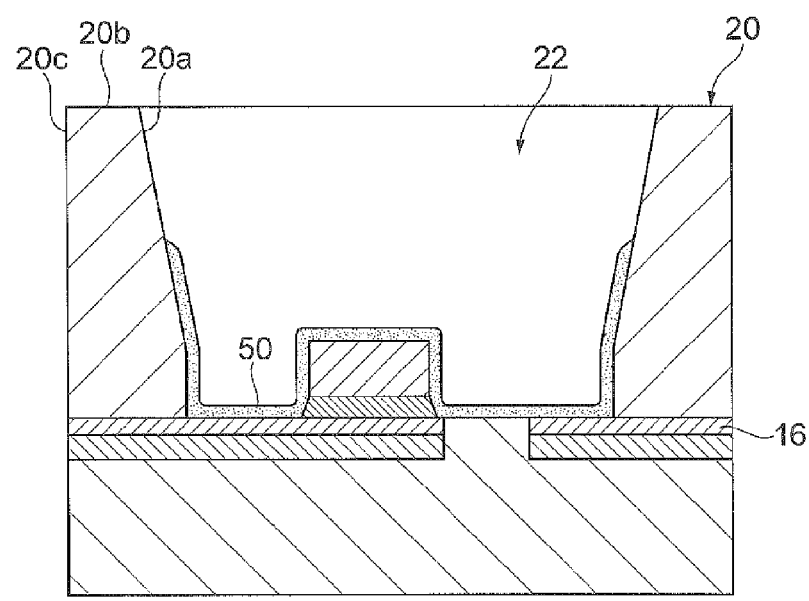

Thus performing the drying step allows the silver surface treatment agent L illustrated in FIG. 5(a) to become the silver sulfidation prevention film 50 covering all over the silver-plated layer 16 and blue LED 30 as illustrated in FIG. 5(a) and the silver surface treatment agent L illustrated in FIG. 5(b) to become the silver sulfidation prevention film 50 covering all over the silver-plated layer 16 and blue LED 30 and a part of the inner peripheral surface 20a of the reflector 20 as illustrated in FIG. 6(b).

Preferably, after the above-mentioned drying step, the silver sulfidation prevention film 50 is fully dried at 150° C. for 30 min in this embodiment. This can further improve the sulfidation prevention effect by narrowing gaps between clay films.

As illustrated in FIG. 4, after the drying step (step S106) ends, the blue LED 30 is subsequently wire-bonded to the silver-plated layer 16 on the anode side or cathode side as a wire-bonding step (step S107). Here, both ends of a wire are bonded to the blue LED 30 and silver-plated layer 16, respectively, so as to break through the silver sulfidation prevention film 50 covering the blue LED 30 and silver-plated layer 16, thereby electrically connecting the blue LED 30 and silver-plated layer 16 to each other. The silver sulfidation prevention film 50 can be broken through by adjusting the thickness of the silver sulfidation prevention film 50, regulating the load of a bonding head for performing the wire-bonding, or vibrating the bonding head, for example.

Next, as a transparent sealing resin filling step (step S108), the inner space 22 formed by the inner peripheral surface 20a of the reflector 20 is filled with the transparent sealing resin 40 containing the fluorescent substance 42. This makes the transparent sealing resin 40 (transparent sealing unit) seal the blue LED 30 and silver-plated layers 16.

Figure 7:
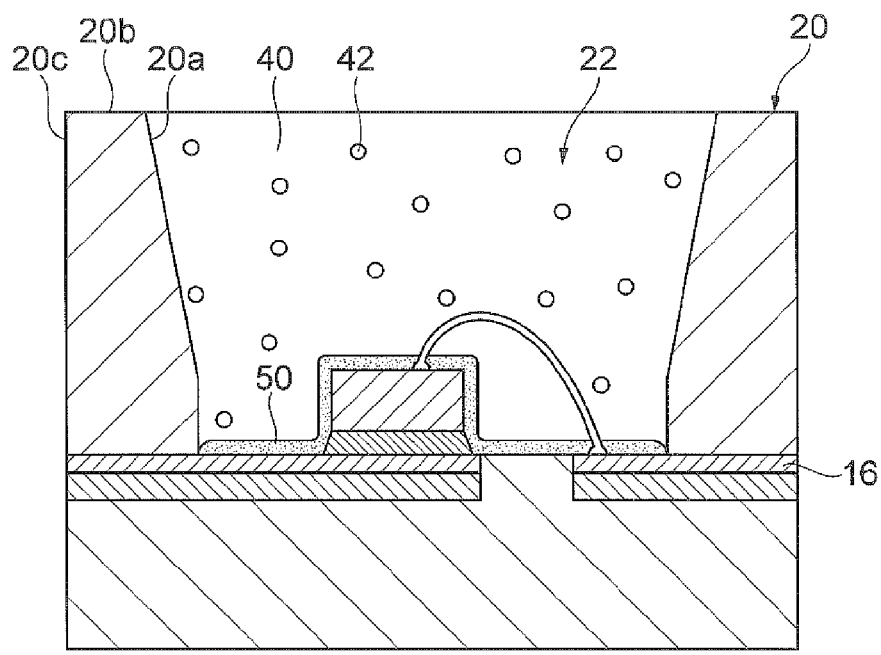
FIG. 7 is a set of sectional views of the light-emitting device after a transparent sealing resin filling step.
Figure 7:
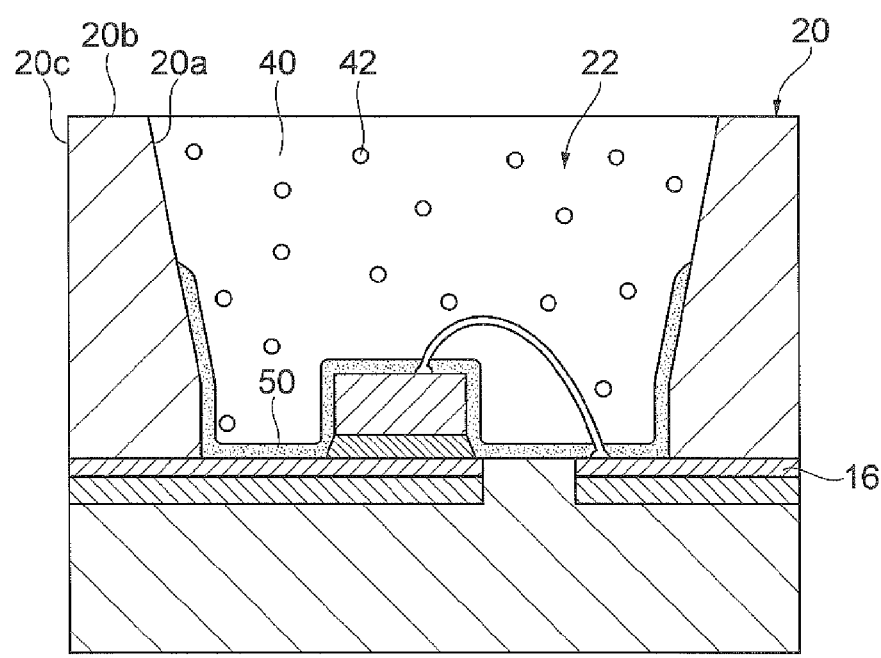

Thus performing the transparent sealing resin filling step allows the light-emitting device 1 illustrated in FIG. 6(a) to become the light-emitting device 1 in which the silver-plated layers 16 and blue LED 30 are sealed with the transparent sealing resin 40 while all of the silver-plated layers 16 and blue LED 30 are covered with the silver sulfidation prevention film 50 as illustrated in FIG. 7(a) and the light-emitting device 1 illustrated in FIG. 6(b) to become the light-emitting device 1 in which the silver-plated layers 16 and blue LED 30 are sealed with the transparent sealing resin 40 while all of the silver-plated layers 16 and blue LED 30 and a part of the inner peripheral surface 20a of the reflector 20 are covered with the silver sulfidation prevention film 50 as illustrated in FIG. 7(b).

Thus, in the method for manufacturing the light-emitting device 1 in accordance with the first embodiment, the silver-plated layers 16 are covered with the silver surface treatment agent of the embodiment, and then the coating of the silver surface treatment agent is dried, so as to form the silver sulfidation prevention film 50 in which the layered silicate compound contained in the silver surface treatment agent is laminated, thereby covering the silver-plated layers 16 with the silver sulfidation prevention Elm 50. This can form the silver sulfidation prevention film 50 that can appropriately cover the silver-plated layers 16.

Dropping or spraying the silver surface treatment agent of the embodiment to the inner space 22 of the reflector 20 provided in the light-emitting device 1 can easily form the silver sulfidation prevention film covering the silver-plated layers.

Second Embodiment

The second embodiment will now be explained. The method for manufacturing the light-emitting device in accordance with the second embodiment is basically the same as that in accordance with the first embodiment but differs therefrom only in the order of steps. Therefore, the following will explain only the parts different from the method for manufacturing the light-emitting device in accordance with the first embodiment, while omitting their common parts.

Figure 9:
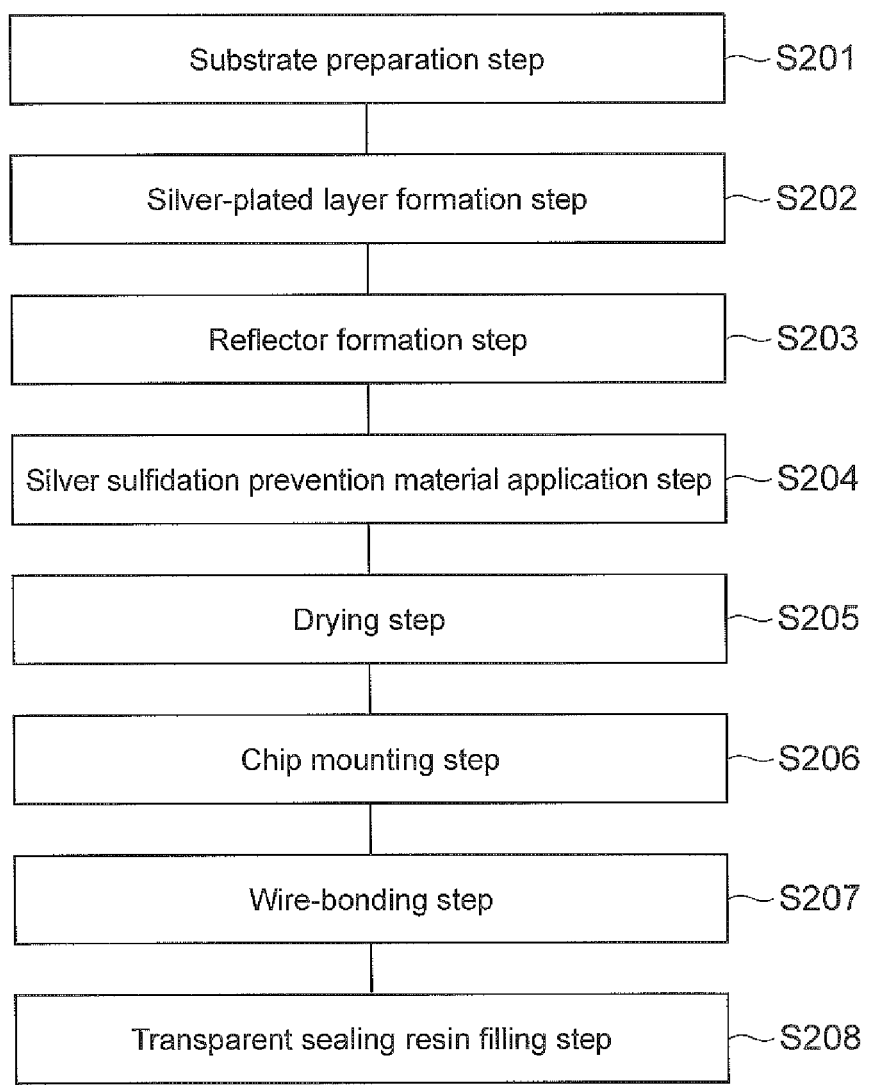
FIG. 9 is a flowchart illustrating a method for manufacturing the light-emitting device in accordance with a second embodiment.
Figure 10:
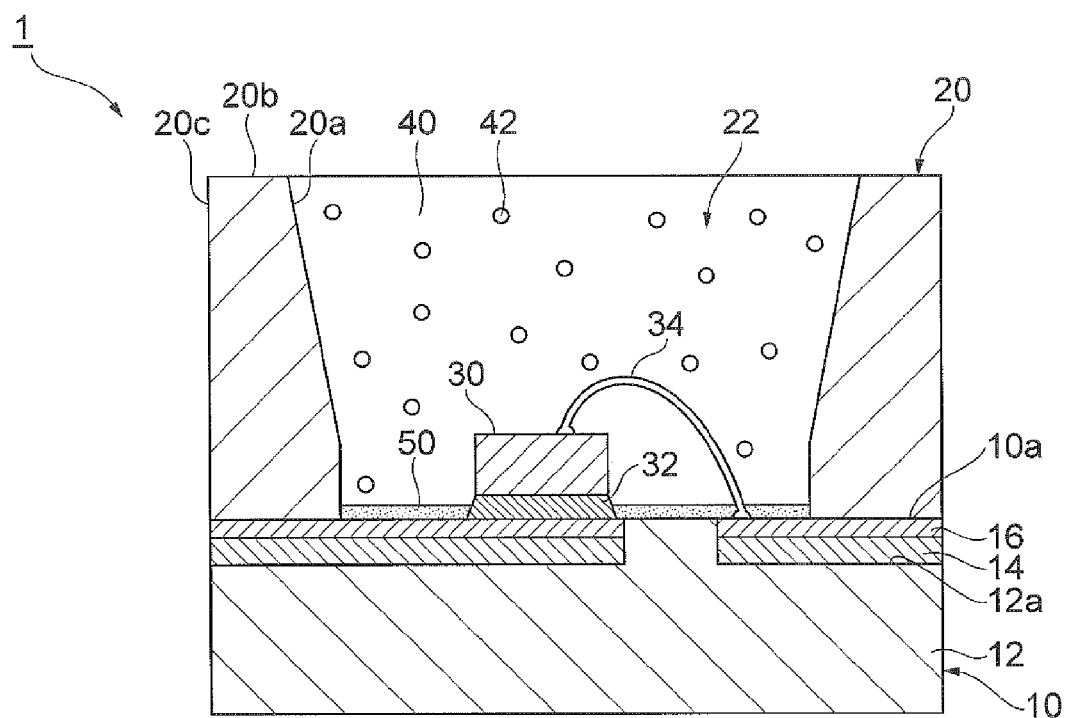
FIG. 10 is a sectional view of the light-emitting device manufactured by the method of FIG. 9.

FIG. 9 is a flowchart illustrating the method for manufacturing the light-emitting device in the second embodiment. FIG. 10 is a sectional view of the light-emitting device manufactured by the method of FIG. 9.

At first in the method for manufacturing the light-emitting device 1 in accordance with the second embodiment, as illustrated in FIG. 9, a substrate preparation step (step S201), a silver-plated layer formation step (step S202), and a reflector formation step (step S203) are performed in this order as in the first embodiment. Here, the substrate preparation step (step S201), silver-plated layer formation step (step S202), and reflector formation step (step S203) are the same as the substrate preparation step (step S101), silver-plated layer formation step (step S102), and reflector formation step (step S103) of the first embodiment, respectively.

Next, as a silver surface treatment agent application step (step S204), the silver surface treatment agent of the embodiment is applied to the silver-plated layers 16, so as to cover them.

Subsequently, as a drying step (step S205), the coating of the silver surface treatment agent applied to the silver-plated layers 16 is dried, so as to form the silver sulfidation prevention film 50. The drying step (step S205) may be performed as with the drying step (step S106) of the first embodiment.

Then, as a chip mounting step (step S206), the blue LED 30 is die-bonded to one of the silver-plated layers 16 on the anode and cathode sides. Here, as in the wire-bonding step (step S107) of the first embodiment, the blue LED 30 is bonded to the silver-plated layer 16 so as to break through the silver sulfidation prevention film 50 covering the silver-plated layer 16, thereby electrically connecting the blue LED 30 and silver-plated layer 16 to each other.

Thereafter, as a wire-bonding step (step S207), the blue LED 30 is wire-bonded to the other of the silver-plated layers 16 on the anode and cathode sides. Here, since the silver-plated layer 16 is covered with the silver sulfidation prevention film 50, one end of a wire is bonded to the silver-plated layer 16 so as to break through the silver sulfidation prevention film 50 covering the silver-plated layer 16 as in the wire-bonding step (step S107) of the first embodiment. On the other hand, since the blue LED 30 is not covered with the silver sulfidation prevention film 50, the other end of the bonding wire 34 can be bonded to the blue LED 30 as usual. This electrically connects the blue LED 30 to the silver-plated layer 16.

Next, as step S208, a transparent sealing resin filling step is performed.

Thus, by performing the chip mounting step after the silver surface treatment agent application step and drying step, the method for manufacturing the light-emitting device in accordance with the second embodiment can manufacture the light-emitting device 1 in which the blue LED 30 is not covered with the silver sulfidation prevention film 50 as illustrated in FIG. 10. This makes it unnecessary for the silver sulfidation prevention film 50 to be broken through when bonding one end of the bonding wire 34 to the blue LED 30 in the wire-bonding step as in the method for manufacturing the light-emitting in accordance with the first embodiment.

Third Embodiment

The third embodiment will now be explained. The method for manufacturing the light-emitting device in accordance with the third embodiment is basically the same as that in accordance with the first embodiment but differs therefrom only in the order of steps. Therefore, the following will explain only the parts different from the method for manufacturing the light-emitting device in accordance with the first embodiment, while omitting their common parts.

Figure 11:
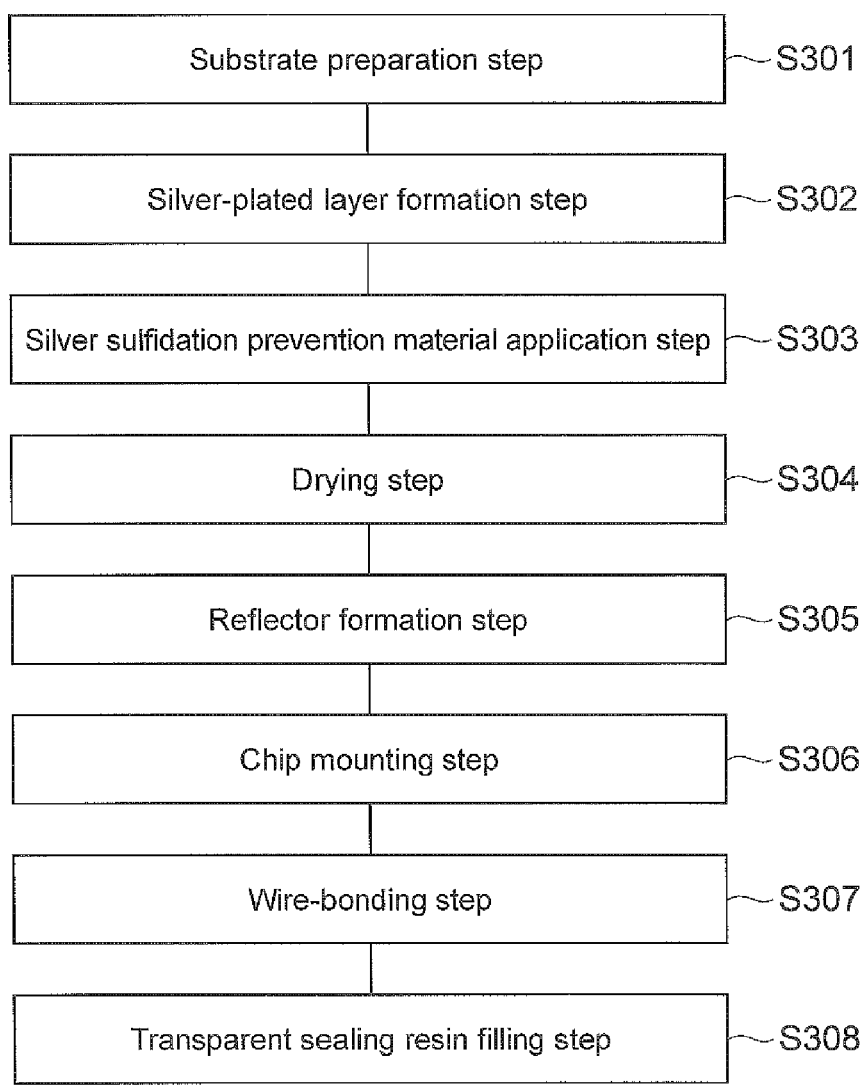
FIG. 11 is a flowchart illustrating a method for manufacturing the light-emitting device in accordance with a third embodiment.
Figure 12:
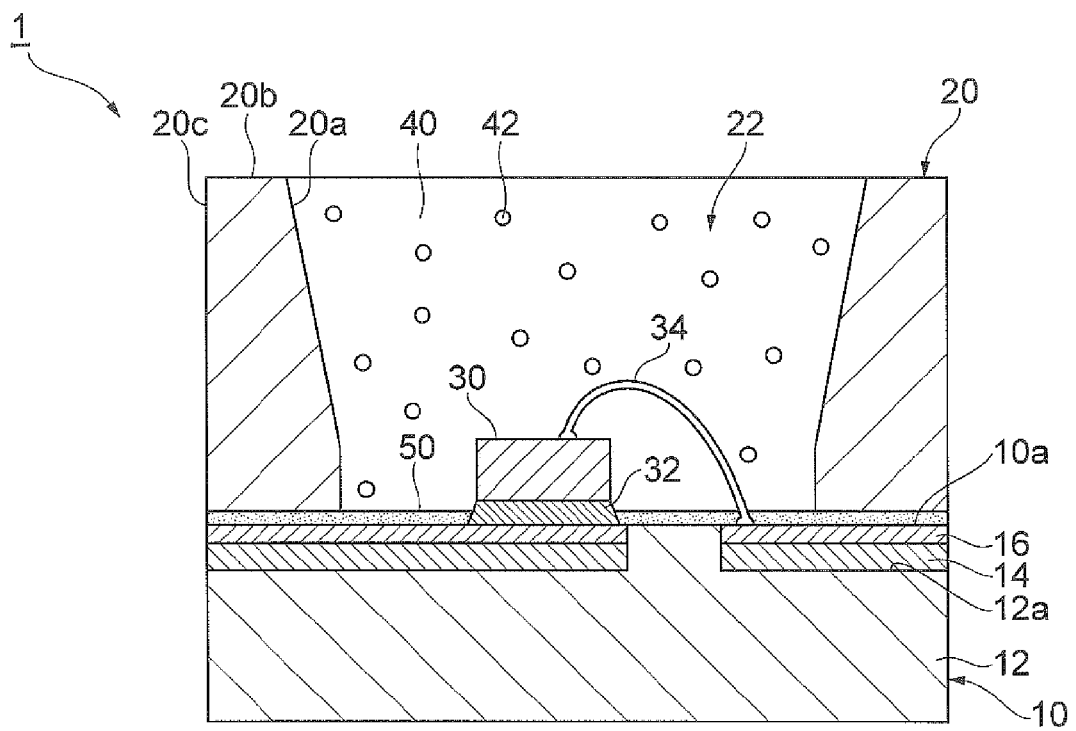
FIG. 12 is a sectional view of the light-emitting device manufactured by the method of FIG. 11.

FIG. 11 is a flowchart illustrating the method for manufacturing the light-emitting device in the third embodiment. FIG. 12 is a sectional view of the light-emitting device manufactured by the method of FIG. 11.

At first in the method for manufacturing the light-emitting device 1 in accordance with the third embodiment, as illustrated in FIG. 11, a substrate preparation step (step S301) and a silver-plated layer formation step (step S302) are performed in this order as in the first embodiment. Here, the substrate preparation step (step S301) and silver-plated layer formation step (step S302) are the same as the substrate preparation step (step S101) and silver-plated layer formation step (step S102) of the first embodiment, respectively.

Next, as a silver surface treatment agent application step (step S303), the silver surface treatment agent of the embodiment is applied to the silver-plated layers 16, so as to cover them. Here, the silver surface treatment agent is preferably applied to the whole front face of the substrate 10 formed with the silver-plated layers 16 from the viewpoint of workability, but may be applied so as to cover the silver-plated layers 16 alone.

Subsequently, as a drying step (step S304), the coating of the silver surface treatment agent applied to the silver-plated layers 16 is dried, so as to form the silver sulfidation prevention film 50. The drying step (step S304) may be performed as with the drying step (step S106) of the first embodiment.

Then, as a reflector formation step (step S305), the reflector 20 is formed on the front face of the substrate 10. Here, when the silver surface treatment agent is applied to the whole front face of the substrate 10 at the silver surface treatment agent application step (step S303), the reflector 20 is formed on the front face of the silver sulfidation prevention film 50 covering the front face of the substrate 10.

Thereafter, as a chip mounting step (step S306), the blue LED 30 is die-bonded to one of the silver-plated layers 16 on the anode and cathode sides. Here, as in the wire-bonding step (step S107) of the first embodiment, the blue LED 30 is bonded to the silver-plated layer 16 so as to break through the silver sulfidation prevention film 50 covering the silver-plated layer 16, thereby electrically connecting the blue LED 30 and silver-plated layer 16 to each other.

Next, as a wire-bonding step (step S307), the blue LED 30 is wire-bonded to the other of the silver-plated layers 16 on the anode and cathode sides. Here, since the silver-plated layer 16 is covered with the silver sulfidation prevention film 50, one end of a wire is bonded to the silver-plated layer 16 so as to break through the silver sulfidation prevention film 50 covering the silver-plated layer 16 as in the wire-bonding step (step S107) of the first embodiment. On the other hand, since the blue LED 30 is not covered with the silver sulfidation prevention film 50, the other end of the bonding wire 34 can be bonded to the blue LED 30 as usual. This electrically connects the blue LED 30 to the silver-plated layer 16.

Subsequently, a transparent sealing resin filling step is performed as step S308.

Thus, by performing the reflector formation step and chip mounting step after the silver surface treatment agent application step and drying step, the method for manufacturing the light-emitting device in accordance with the third embodiment can manufacture the light-emitting device 1 in which the blue LED 30 is not covered with the silver sulfidation prevention film 50 as illustrated in FIG. 12. This makes it unnecessary for the silver sulfidation prevention film 50 to be broken through when bonding one end of the bonding wire 34 to the blue LED 30 in the wire-bonding step as in the method for manufacturing the light-emitting in accordance with the first embodiment.

Though preferred embodiments of the present invention are explained in the foregoing, the present invention is not limited thereto.

While the above-mentioned embodiments are explained as those adopting the blue LED 30 that generates blue light as a light-emitting diode to be bonded to the light-emitting device 1, light-emitting diodes generating light other than the blue light may also be employed.

The light-emitting devices 1 of the above-mentioned embodiments are explained as being equipped with the reflector 20 surrounding the blue LED, but may be free of the reflector 20.

The silver surface treatment agent of the embodiment can form a silver sulfidation prevention film which is excellent in preventing silver from discoloring, in particular in preventing silver from being sulfurized, and thus can attain sufficient resistance to sulfidation also in light-emitting devices using sulfur-containing compounds such as $Y_2O_2S$:Eu (red), ZnS: Cu (green), ZnS:Ag (blue), and compounds set forth in Japanese Patent Application Laid-Open No. H08-085787 which have conventionally been in use as fluorescent substances.

The silver surface treatment agent of the embodiment is applicable to not only the above-mentioned light-emitting devices, but also to plasma displays, liquid-crystal displays, and the like equipped with reflection prevention films containing silver, for example.

EXAMPLES

The present invention will now be explained more specifically with reference to examples and comparative examples but will not be limited to the following examples.

Example A-1

As a layered silicate compound, mica (ME-100 manufactured by CO-OP Chemical Co., Ltd.) was prepared. A 1 mass % aqueous solution of this mica was produced and put into a centrifuge (MX-301 manufactured by TOMY), so as to fractionate a part of mica having an average longer side length of 30000 nm, and then water was removed therefrom. Distilled water was added to 1 g of thus obtained mica so that they attained a total weight of 100 g, and the resulting product was mixed for 10 min at 2000 rpm and then degassed for 10 min at 2200 rpm by using a planetary centrifugal mixer (ARE-310 manufactured by Thinky Corporation), so as to yield a surface treatment agent containing 1 mass % of mica having an average longer side length of 30000 nm.

The average longer side length of the layered silicate was determined by averaging the longer side lengths of all the particles in an image within an area of 100 μm (L)×100 μm (W) at a center part of a silver substrate coated with the surface treatment agent (after removing the solvent), which will be explained later, by using a transmission electron microscope (JEM-2100F manufactured by JEOL). Taken as the longer side length of each particle was the maximum length of a longer side of a rectangle circumscribing the particle.

[Application of the Surface Treatment Agent onto the Silver Substrate]

The surface treatment agent containing 1 mass % of mica obtained above was applied by using a bar coater with a wet thickness of 12 μm onto a silver substrate formed by vapor-depositing silver having a thickness of 100 nm on a glass slide made of soda glass and then stood still for 12 h at 22° C., so as to remove the solvent, thereby yielding a silver substrate having a mica film on a surface. Here, the wet thickness is the thickness of the surface treatment agent immediately after it is applied before removing the solvent.

[Making of a Light-Emitting Device]

A light-emitting diode chip having a light-emitting wavelength of 467.5 nm to 470 nm and a volume of 3.7 μL was connected onto a silver-plated substrate with a gold wire, so as to make a light-emitting device. Subsequently, 0.2 mL of the 1 mass % surface treatment agent was dropped on the light-emitting diode by potting, i.e., with a dropper, and then stood still for 12 h at 22° C., so as to remove the solvent, thereby yielding a light-emitting device having a mica film on the silver-plated substrate.

[Evaluation of Hydrogen Sulfide Gas Resistance of the Silver Substrate Coated with the Surface Treatment Agent]

First, the visible light reflectance at a wavelength of 550 nm of the silver substrate having the mica film on the surface was measured by a spectrophotometer (V-570 manufactured by JASCO Corporation) as "reflectance before hydrogen sulfide exposure." Next, the silver substrate having the mica film on the surface was stood still for 96 h in a 10 ppm hydrogen sulfide gas flow at 40° C., 90% RH (relative humidity), and then the visible light reflectance at the wavelength of 550 nm was measured as "reflectance after hydrogen sulfide exposure." The reflectance drop ratio was determined by [reflectance before hydrogen sulfide exposure]−[reflectance after hydrogen sulfide exposure]=[reflectance drop ratio]. Table 1 lists the results.

[Evaluation of Hydrogen Sulfide Gas Resistance of the Light-Emitting Device Coated with the Surface Treatment Agent]

The light-emitting device having the mica film on the surface was caused to emit light at a forward current of 20 mA and a forward voltage of 3.3 V, and its light emission intensity was measured at an exposure time of 30 ms by a multiphotometer (MCPD-3700 manufactured by Otsuka Electronics Co., Ltd.) as "emission intensity before hydrogen sulfide exposure." Next, the light-emitting device having the mica film on the surface was stood still for 96 h in a 10 ppm hydrogen sulfide gas flow at 40° C., 90% RH (relative humidity), and then the light-emitting device was caused to emit light at the forward current of 20 mA and the forward voltage of 3.3 V, while its light emission intensity was measured at an exposure time of 30 ms by the multiphotometer as "emission intensity after hydrogen sulfide exposure." The emission intensity maintenance ratio was determined by ([emission intensity after hydrogen sulfide exposure]/[emission intensity before hydrogen sulfide exposure])×100=[emission intensity maintenance ratio]. Table 1 lists the results.

treatment agent was made and evaluated as in Example A-1 except for using thus obtained mica.

Example A-4

A surface treatment agent was made and evaluated as in Example A-1 except for using mica having an average longer side length of 1000 nm (NTS-5 manufactured by Topy Industries Ltd.).

Example A-5

A surface treatment agent was made and evaluated as in Example A-1 except for using mica having an average longer side length of 500 nm (NHT-B2 manufactured by Topy Industries Ltd.).

Example A-6

As a layered silicate compound, montmorillonite (Kunipia F manufactured by Kunimine Industries Co., Ltd.) was prepared. A 1 mass % aqueous solution of this montmorillonite was produced, and a part thereof having an average longer side length of 5000 nm was fractionated by a centrifuge (MX-301 manufactured by TOMY), and then water was

TABLE 1

| | Layered silicate compound | Average longer side length of layered silicate compound (nm) | 2nd silicate compound | Hydrogen sulfide resistance of silver substrate (reflectance drop ratio %) | Hydrogen sulfide resistance of light-emitting device (emission intensity maintenance ratio %) |
|---|---|---|---|---|---|
| Example A-1 | mica | 30000 | — | 2 | 98 |
| Example A-2 | mica | 20000 | — | 2 | 98 |
| Example A-3 | mica | 10000 | — | 2 | 98 |
| Example A-4 | mica | 1000 | — | 5 | 95 |
| Example A-5 | mica | 500 | — | 5 | 95 |
| Example A-6 | montmorillonite | 5000 | — | 5 | 95 |
| Example A-7 | montmorillonite | 2000 | — | 5 | 95 |
| Example A-8 | montmorillonite | 1000 | — | 5 | 95 |
| Example A-9 | stevensite | 50 | — | 10 | 90 |
| Example A-10 | mica | 10000 | LSS35 | 5 | 95 |
| Example A-11 | montmorillonite | 1000 | LSS35 | 5 | 95 |
| Example A-12 | stevensite | 50 | LSS35 | 10 | 90 |
| Example A-13 | stevensite | 20 | — | 20 | 80 |
| Example A-14 | stevensite | 10 | — | 20 | 80 |
| Comparative Example A-1 | — | — | — | 60 | 40 |

Example A-2

A surface treatment agent was made and evaluated as in Example A-1 except for using mica having an average longer side length of 20000 nm (MK-300 manufactured by CO-OP Chemical Co., Ltd.).

Example A-3

As a layered silicate compound, mica (ME-100 manufactured by CO-OP Chemical Co., Ltd.) was prepared. A 1 mass % aqueous solution of this mica was produced, and a part thereof having an average longer side length of 10000 nm was fractionated by a centrifuge (MX-301 manufactured by TOMY), and then water was removed therefrom. A surface removed therefrom. A surface treatment agent was made and evaluated as in Example A-1 except for using thus obtained montmorillonite.

Example A-7

A surface treatment agent was made and evaluated as in Example A-1 except for using montmorillonite (Kunipia F manufactured by Kunimine Industries Co., Ltd.) having an average longer side length of 2000 nm fractionated by a centrifuge (MX-301 manufactured by TOMY).

Example A-8

A surface treatment agent was made and evaluated as in Example A-1 except for using montmorillonite (Kunipia F manufactured by Kunimine Industries Co., Ltd.) having an average longer side length of 1000 nm fractionated by a centrifuge (MX-301 manufactured by TOMY).

Example A-9

A surface treatment agent was made and evaluated as in Example A-1 except for using stevensite having an average longer side length of 50 nm (Sumecton SA manufactured by Kunimine Industries Co., Ltd.).

Example A-10

A surface treatment agent was made and evaluated as in Example A-1 except for using 0.99 g of mica (ME-100 manufactured by CO-OP Chemical Co., Ltd.) having an average longer side length of 10000 nm fractionated by Example A-3 as a layered silicate compound and 0.01 g of lithium silicate (LSS35 manufactured by Nissan Chemical Industries, Ltd.) as a second silicate compound.

Example A-11

A surface treatment agent was made and evaluated as in Example A-1 except for using 0.99 g of montmorillonite (Kunipia F manufactured by Kunimine Industries Co., Ltd.) having an average longer side length of 1000 nm fractionated by Example A-8 as a layered silicate compound and 0.01 g of lithium silicate (LSS35 manufactured by Nissan Chemical Industries, Ltd.) as a second silicate compound.

Example A-12

As a layered silicate compound, stevensite (Sumecton SA manufactured by Kunimine Industries Co., Ltd.) was prepared. A 1 mass % aqueous solution of this stevensite was produced and put into a centrifuge (MX-301 manufactured by TOMY), so as to fractionate a part thereof having an average longer side length of 50 nm, and then water was removed therefrom. A surface treatment agent was made and evaluated as in Example A-1 except for using 0.99 g of thus obtained stevensite as a layered silicate compound and 0.01 g of lithium silicate (LSS35 manufactured by Nissan Chemical Industries, Ltd.) as a second silicate compound.

Example A-13

A surface treatment agent was made and evaluated as in Example A-1 except for using stevensite (Sumecton SA manufactured by Kunimine Industries Co., Ltd.) having an average longer side length of 20 nm fractionated by a centrifuge (MX-301 manufactured by TOMY).

Example A-14

A surface treatment agent was made and evaluated as in Example A-1 except for using stevensite (Sumecton SA manufactured by Kunimine Industries Co., Ltd.) having an average longer side length of 10 nm fractionated by a centrifuge (MX-301 manufactured by TOMY).

Comparative Example A-1

A silver substrate and a light-emitting device were made without using any surface treatment agent and evaluated as in Example A-1.

It is seen from Table 1 that the silver substrate and light-emitting diode attain the hydrogen sulfide gas resistance in each of Examples A-1 to A-14.

Synthesis of Stevensite

Examples of Synthesis

To a dispersion in which 60 g of colloidal silica (Ludox TM 50 manufactured by Sigma-Aldrich Co.) and 120 ml of distilled water were mixed, 20 ml of nitric acid was added. To the resulting product, while a solution in which 91 g of magnesium nitrate (first-grade reagent) and 128 ml of distilled water were mixed was added thereto with stirring, aqueous ammonia (28 mass % aqueous solution) was dropped slowly. The drop was stopped at a pH of 10, and the mixture was aged for one night at room temperature, so as to yield a uniform coprecipitate. Thereafter, water washing comprising addition of distilled water, shaking, and solid-liquid separation was repeated until there was no smell of ammonia. To the dispersion of the fully washed uniform coprecipitate, 25.4 ml of a 10 mass % aqueous lithium hydroxide solution was added, and they were mixed well, so as to yield a starting material slurry. The starting material slurry was put into an autoclave and subjected to a hydrothermal reaction for 48 h at 200° C. After cooling, the reaction product was taken out from within the autoclave, dried at 60° C., and then pulverized, so as to synthesize smectites, classified into stevensite, having the following average longer side lengths:

Average longer side length (nm): 1007, 950, 780, 190, 178, 140, 124, 120, 100

Examples B-1 to B-9

Surface treatment agents were made and evaluated as in Example A-1 except for using smectites having the average longer side lengths listed in Table 2.

Examples B-10 to B-12

Surface treatment agents were made and evaluated as in Example A-1 except for using 0.99 g of smectites having the average longer side lengths listed in Table 2 as a layered silicate compound and 0.01 g of lithium silicate (LSS35 manufactured by Nissan Chemical Industries, Ltd.) as a second silicate compound.

TABLE 2

|  | Layered silicate compound | Average longer side length of layered silicate compound (nm) | 2nd silicate compound | Hydrogen sulfide resistance of silver substrate (reflectance drop ratio %) | Hydrogen sulfide resistance of light-emitting device (emission intensity maintenance ratio %) |
| --- | --- | --- | --- | --- | --- |
| Example B-1 | smectite | 1007 | — | 5 | 95 |
| Example B-2 | smectite | 950 | — | 5 | 95 |

TABLE 2-continued

|  | Layered silicate compound | Average longer side length of layered silicate compound (nm) | 2nd silicate compound | Hydrogen sulfide resistance of silver substrate (reflectance drop ratio %) | Hydrogen sulfide resistance of light-emitting device (emission intensity maintenance ratio %) |
|---|---|---|---|---|---|
| Example B-3 | smectite | 780 | — | 5 | 95 |
| Example B-4 | smectite | 190 | — | 5 | 95 |
| Example B-5 | smectite | 178 | — | 5 | 95 |
| Example B-6 | smectite | 140 | — | 5 | 95 |
| Example B-7 | smectite | 124 | — | 5 | 95 |
| Example B-8 | smectite | 120 | — | 5 | 95 |
| Example B-9 | smectite | 100 | — | 10 | 90 |
| Example B-10 | smectite | 1007 | LSS35 | 5 | 95 |
| Example B-11 | smectite | 190 | LSS35 | 5 | 95 |
| Example B-12 | smectite | 100 | LSS35 | 10 | 90 |

REFERENCE SIGNS LIST

1: light-emitting device; 10: substrate; 10a: substrate front face; 12: support; 14: copper-plated sheet; 16: copper-plated layer; 20: reflector (light-reflecting unit); 20a: inner peripheral surface; 20b: top surface; 20c: outer peripheral surface; 22: inner space; 30: blue LED (blue-emitting diode); 32: die-bond material; 34: bonding wire; 40: transparent sealing resin (transparent sealing unit); 42: fluorescent substance; 50: silver sulfidation prevention film; L: silver surface treatment agent

The invention claimed is:

1. A light-emitting device comprising a substrate having a silver-plated layer; a light-emitting diode mounted on the substrate; a film, provided on a surface of the silver-plated layer, containing a layered silicate compound; and a transparent sealing resin sealing the light-emitting diode, the transparent sealing resin having a composition different than a composition of the film.

2. The light-emitting device according to claim 1, wherein the film has an organic matter content less than 0.5%.

3. The light-emitting device according to claim 1, wherein a thickness of the film is 0.01 to 1000 μm.

4. The light-emitting device according to claim 1, wherein a content of the layered silicate compound in the film based on a whole amount of the film is preferably at least 80 mass %.

5. The light-emitting device according to claim 4, wherein the film has an organic matter content less than 0.5%.

* * * * *